United States Patent
Liang et al.

(10) Patent No.: US 9,985,145 B1
(45) Date of Patent: May 29, 2018

(54) VARIABLE CAPACITOR STRUCTURES WITH REDUCED CHANNEL RESISTANCE

(71) Applicant: QUALCOMM Incorporated, San Diego, CA (US)

(72) Inventors: Qingqing Liang, San Diego, CA (US); Francesco Carobolante, San Diego, CA (US); Fabio Alessio Marino, San Marcos, CA (US); Narasimhulu Kanike, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/494,187

(22) Filed: Apr. 21, 2017

(51) Int. Cl.
| | | |
|---|---|---|
| *H01L 29/93* | (2006.01) | |
| *H01L 29/10* | (2006.01) | |
| *H01L 29/94* | (2006.01) | |
| *H01L 29/66* | (2006.01) | |

(52) U.S. Cl.
CPC .......... *H01L 29/93* (2013.01); *H01L 29/107* (2013.01); *H01L 29/1025* (2013.01); *H01L 29/66174* (2013.01); *H01L 29/66181* (2013.01); *H01L 29/94* (2013.01)

(58) Field of Classification Search
CPC .............. H01L 29/93; H01L 29/66174; H01L 29/66181; H01L 29/94; H01L 29/107; H01L 29/1025
See application file for complete search history.

(56) References Cited

U.S. PATENT DOCUMENTS

| | | |
|---|---|---|
| 6,351,020 B1 | 2/2002 | Tarabbia et al. |
| 2008/0237677 A1* | 10/2008 | Futatsugi .......... H01L 29/66075 257/312 |
| 2010/0258910 A1 | 10/2010 | Sarkar |
| 2012/0281336 A1 | 11/2012 | Marino et al. |
| 2015/0194538 A1 | 7/2015 | Marino et al. |

FOREIGN PATENT DOCUMENTS

WO    WO-2014194336 A2    12/2014

\* cited by examiner

*Primary Examiner* — David Vu
(74) *Attorney, Agent, or Firm* — Patterson & Sheridan, LLP (57) ABSTRACT

Certain aspects of the present disclosure provide a semiconductor capacitor. The semiconductor capacitor generally includes a first non-insulative region disposed above an insulative layer, an insulative region, and a second non-insulative region disposed adjacent to the insulative region, wherein the insulative layer is disposed above the second non-insulative region and the insulative region. In some cases, at least a portion of the insulative region is disposed above one or more portions of the second non-insulative region.

9 Claims, 13 Drawing Sheets

FIG. 11

VARIABLE CAPACITOR STRUCTURES WITH REDUCED CHANNEL RESISTANCE

TECHNICAL FIELD

Certain aspects of the present disclosure generally relate to electronic circuits and, more particularly, to variable semiconductor capacitors.

BACKGROUND

Semiconductor capacitors are fundamental components for integrated circuits. A variable capacitor is a capacitor whose capacitance may be intentionally and repeatedly changed under the influence of a bias voltage. A variable capacitor, which may be referred to as a varactor, is often used in inductor-capacitor (LC) circuits to set the resonance frequency of an oscillator, or as a variable reactance, e.g., for impedance matching in antenna tuners.

A voltage-controlled oscillator (VCO) is an example circuit that may use a varactor in which the thickness of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure generally relate to a structure for a semiconductor variable capacitor with reduced channel resistance and increased quality factor, over conventional semiconductor variable capacitors.

Certain aspects of the present disclosure provide a semiconductor variable capacitor. The semiconductor variable capacitor generally includes a first non-insulative region disposed above an insulative layer; a second non-insulative region disposed adjacent to an insulative region, wherein the insulative layer is disposed above the second non-insulative region and the insulative region, wherein at least a portion of the insulative region is disposed above one or more portions of at least one of the second non-insulative region.

Certain aspects of the present disclosure provide a semiconductor variable capacitor. The semiconductor variable capacitor generally includes a first non-insulative region disposed adjacent to at least one of a first control region or an insulative region; a second non-insulative region disposed adjacent to the at least one of the first control region or the insulative region; and a second control region disposed above an insulative layer, the insulative layer disposed above the at least one of the first control region or the insulative region, wherein the second control region is disposed above the first non-insulative region and the second non-insulative region, and the first control region and the second control region are configured such that a capacitance between the first non-insulative region and the second non-insulative region is configured to be adjusted by varying a control voltage applied to at least one of the first control region or the second control region.

Certain aspects of the present disclosure provide a method for fabricating a semiconductor variable capacitor, in accordance with certain aspects of the present disclosure. The method generally includes forming a first non-insulative region above an insulative layer; forming a second non-insulative region adjacent to an insulative region, wherein the insulative layer is disposed above the second non-insulative region and the insulative region. In certain aspects, at least a portion of the insulative region is disposed above one or more portions of the second non-insulative region.

Certain aspects of the present disclosure provide a method for fabricating a semiconductor variable capacitor, in accordance with certain aspects of the present disclosure. The method generally includes forming a first non-insulative region adjacent to at least one of a first control region or an insulative region; forming a second non-insulative region adjacent to the at least one of the first control region or the insulative region; forming an insulative layer above the at least one of the first control region or the insulative region; and forming a second control region above the insulative layer. In certain aspects, the second control region is disposed above the first non-insulative region and the second non-insulative region. The first control region and the second control region may be configured such that a capacitance between the first non-insulative region and the second non-insulative region is configured to be adjusted by varying a control voltage applied to at least one of the first control region or the second control region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a semiconductor variable capacitor structure, such as a transcap (TC) device, suitable for integrated circuits. A TC device may have at least three terminals, where the capacitance between two main terminals of the device (C1 and C2) can be varied by changing a voltage applied between a control terminal CTRL and one of the other two main terminals (e.g., C2). Certain aspects of the present disclosure are generally directed to a TC device structure that reduces the channel resistance of the variable capacitor, in an effort to increase the quality factor (Q) of the variable capacitor.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Figure 1:
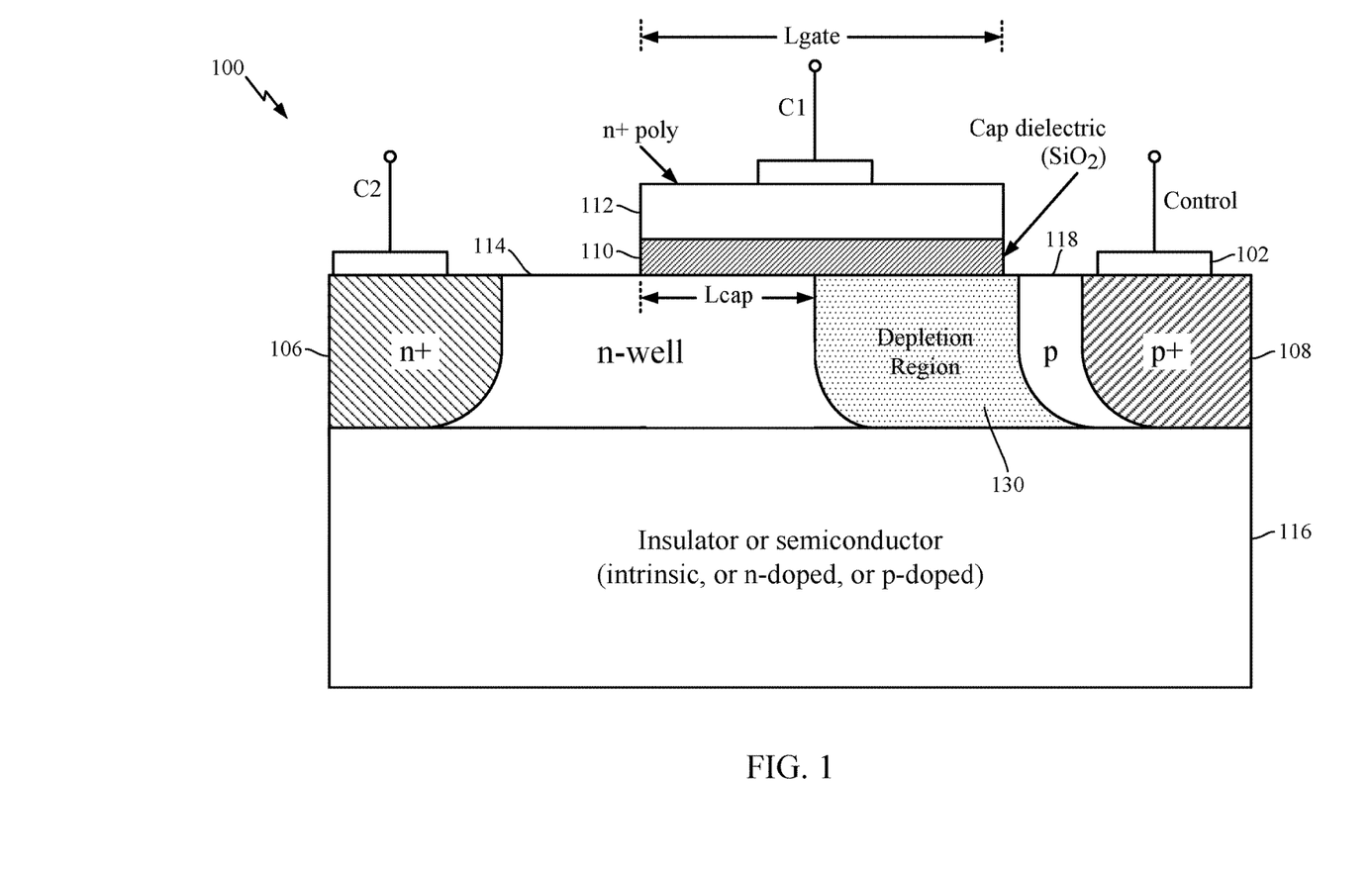
FIG. 1 illustrates a cross-sectional view of an example variable capacitor.

FIG. 1 illustrates a cross-sectional view of an example structure of a TC device 100. Certain implementations of a TC device use an oxide layer 110, which may be similar to oxide layers used to fabricate metal-oxide semiconductor (MOS) devices (e.g., thin or thick gate oxide). The oxide layer 110 may isolate the C1 and C2 terminals, and thus, in effect act as a dielectric for the TC device 100. A non-insulative region 106 (e.g., n+ implantation region) and a non-insulative region 108 (e.g., p+ implantation region) may be formed on the two sides of the TC device 100 in order to create p-n junctions. As used herein, a non-insulative region and a control region generally refer to regions that may be conductive or semiconductive. A bias voltage may be applied between the control terminal 102 and the C2 terminal in order to modulate the capacitance between terminals C1 and C2. For example, by applying a bias voltage to the control terminal 102, a depletion region 130 may be formed at the p-n junction between the non-insulative region 108 (e.g., control region) and the semiconductor region 120 (e.g., n-well region). Based on the bias voltage, this depletion region 130 may widen under the oxide layer 110, reducing the area of the equivalent electrode.

The length Lgate is the length of the non-insulative region 112 (e.g., the upper capacitance plate), whereas Lcap is the length of the lower equivalent capacitance plate. The length Lcap can vary based on the size of the depletion region 130, and with it, the effective capacitance area and capacitance value of the TC device 100.

The work-function of a non-insulative region 112 above the oxide layer 110 may be chosen to improve the device performance. For example, an n-doped poly-silicon material may be used (instead of p-doped), even if the semiconductor region 114 underneath the oxide layer 110 is doped with n-type impurities. In some aspects, a metallic material (also doped if desired) may be used for the non-insulative region 112 with an opportune work-function or a multi-layer stack of different metallic materials so as to obtain the desired work-function. In certain aspects, non-insulative region 112 may be divided into two sub-regions, one n-doped and one p-doped, or a different metallic material may be used for each sub-region.

In some cases, the semiconductor region 114 may be disposed above an insulator or semiconductor region 116. The type of material for the semiconductor region 116 may be chosen in order to improve the TC device 100 performance. For example, the semiconductor region 116 may be an insulator, a semi-insulator, or an intrinsic/near-intrinsic semiconductor in order to decrease the parasitic capacitances associated with the substrate (not shown). In some cases, the semiconductor region 116 can be made of n-doped or p-doped semiconductor with an appropriate doping profile in order to increase the TC device quality factor and/or the control on the depletion region 130 that may be formed between the non-insulative region 108 and the semiconductor region 114 when applying a bias voltage to the control terminal 102. The semiconductor region 116 can also be formed by multiple semiconductor layers or regions doped in different ways (n, p, or intrinsic). Furthermore, the semiconductor region 116 may include semiconductors, insulating layers, and/or substrates or can be formed above semiconductors, insulating layers, and/or substrates.

To better understand the working principle of the TC device 100, it may be assumed that the control terminal 102 is biased with a negative voltage with respect to the C2 terminal, for example. The width of the depletion region 130 in the semiconductor region 114 may be controlled by applying a control voltage to the control terminal 102. The capacitance between the C1 and C2 terminals may depend on the dimensions of the depletion region 130 in the semiconductor region 114, and thus, can be controlled by applying the control voltage to the control terminal 102. Furthermore, the variation of the bias voltage applied to the control terminal 102 may not alter the DC voltage between the C1 and C2 terminals, allowing for improved control of the device characteristics.

In some cases, it may be preferable to have the non-insulative region 106 and/or non-insulative region 108 a distance away from the oxide layer 110 in order to reduce the parasitic capacitance associated with the non-insulative region 108 and improve the isolation of the non-insulative region 106 for high control voltages. For example, the non-insulative region 106 can be partially overlapped with the oxide layer 110, or the non-insulative region 106 can be formed at a distance from the edge of the oxide layer 110 so as to increase the device tuning range and linearity. In the latter case, the voltage-withstanding capability of the device is increased since a portion of a radio frequency (RF) signal, that may be applied to the C1 and C2 terminals, drops between the oxide edge and the non-insulative region 106 instead of being applied entirely across the oxide layer 110. The non-insulative region 108 can be partially overlapped with the oxide layer 110, or the non-insulative region 108 can be spaced apart so as to reduce the parasitic capacitance between the C1 terminal and the control terminal 102. A p-doped region 118 can be optionally used to increase the breakdown voltage of the p-n junction between non-insulative region 108 and semiconductor region 114, decreasing, at the same time, the parasitic capacitance between the C1 terminal and the control terminal 102.

The gate resistance of a device fabricated using the advanced high-k metal gate (HKMG) process is higher than the gate resistance of a device implemented with poly gate and almost dominates the series resistance in short channel devices. The HKMG process degrades the Q of variable capacitors that use the gate as one terminal of the capacitor, as is the case with TC devices. To improve the Q of the TC device, the length Lcap may be reduced by reducing the gate length Lgate. However, reducing the gate length Lgate also increases the gate resistance Rgate, in accordance with the following equation:

$$Rgate = \rho \frac{W}{LT}$$

where ρ represents the resistivity of the semiconductor region 120, W represents the width of the non-insulative region 112, L represents the length of the non-insulative region 112, and T represents the thickness of the non-insulative region 112. Certain aspects of the present disclosure provide a TC structure that reduces the channel resistance of the TC device by allowing for the length Lcap to be reduced, while maintaining a long gate length Lgate, increasing the Q of the TC device.

Figure 2A:
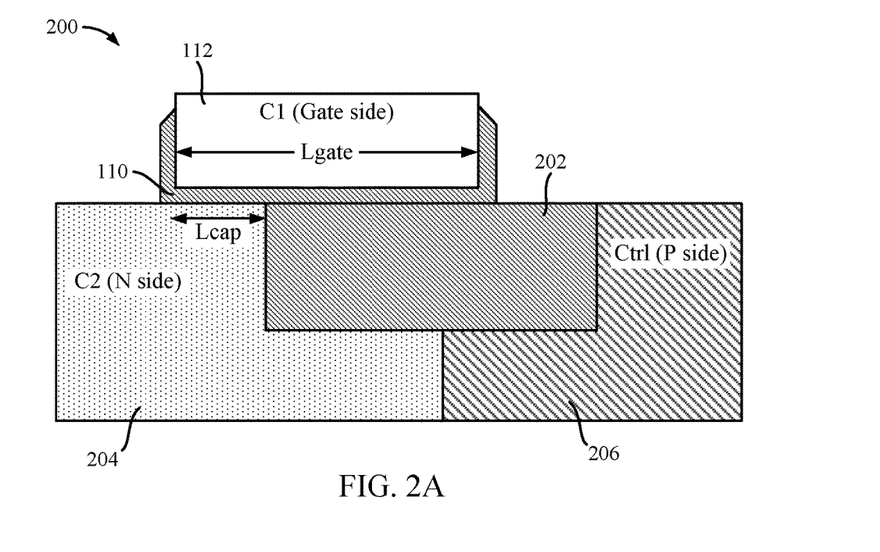
FIGS. 2A and 2B illustrate an example structure of a variable capacitor implemented using an insulative region to reduce channel length, in accordance with certain aspects of the present disclosure.
Figure 2B:
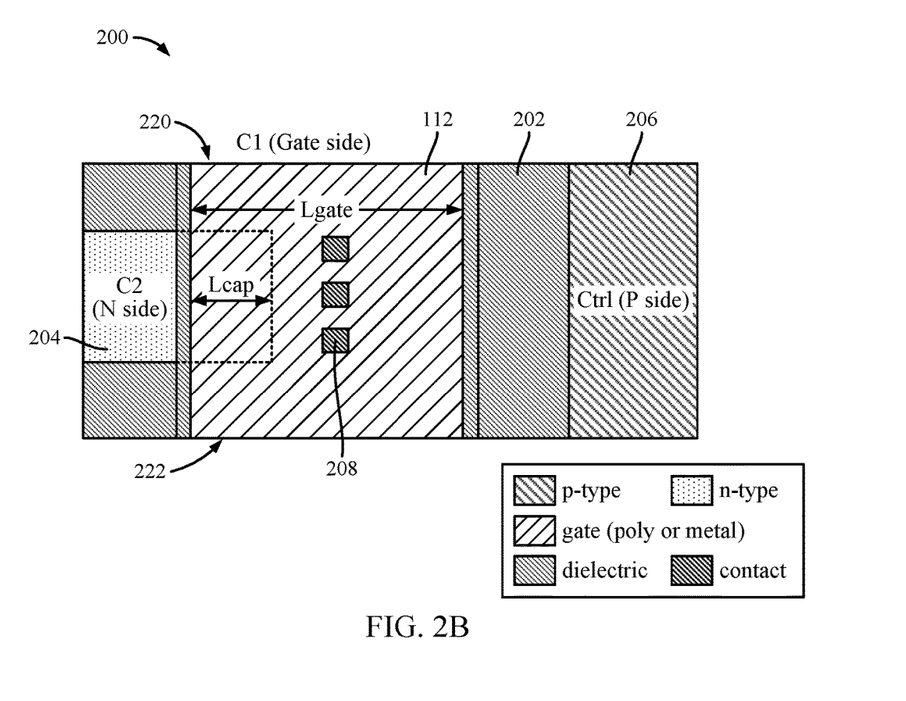

FIGS. 2A and 2B illustrate a cross-sectional view and a top-down view, respectively, of an example structure of a TC device 200, in accordance with certain aspects of the present disclosure. The length Lcap may represent the overlap between the non-insulative region 112 on the gate side and the non-insulative region 204. In certain aspects, the non-insulative region 204 may correspond to the non-insulative region 106 and the semiconductor region 114. As illustrated, the length Lcap can be reduced by forming an insulative region 202 (e.g., a dielectric region) below a portion of the non-insulative region 112, thereby separating at least a portion of the non-insulative region 204 from at least a portion of the control region 206 in a region near the non-insulative region 112. In this manner, the length Lcap can be reduced independently of the gate length Lgate. In certain aspects, the insulative region 202 may be formed above at least one of another portion of the control region 206 or another portion of the non-insulative region 204.

In one plane, the insulative region 202 may be formed adjacent to at least three sides of the non-insulative region 204 as viewed from the top down in FIG. 2B. In certain aspects, the insulative region 202 may be a shallow trench isolation (STI) region. In this case, one or more contacts 208 may be formed above the non-insulative region 112. For certain aspects, contact placement may be limited to areas above an STI region. Thus, by having the STI region (e.g., insulative region 202) below the non-insulative region 112, the one or more contacts 208 can be formed above the non-insulative region 112. In this case, the non-insulative region 112 may extend to the two edges 220 and 222 of the structure of the TC device 200 as viewed from the top-down.

Figure 3A:
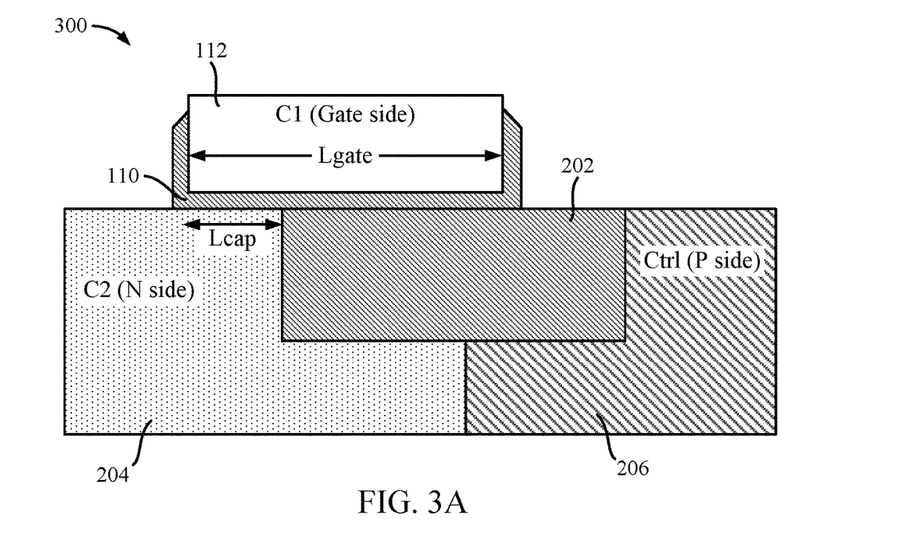
FIGS. 3A and 3B illustrate an example structure of a semiconductor variable capacitor with a non-insulative region extending to an edge of the structure, in accordance with certain aspects of the present disclosure.
Figure 3B:
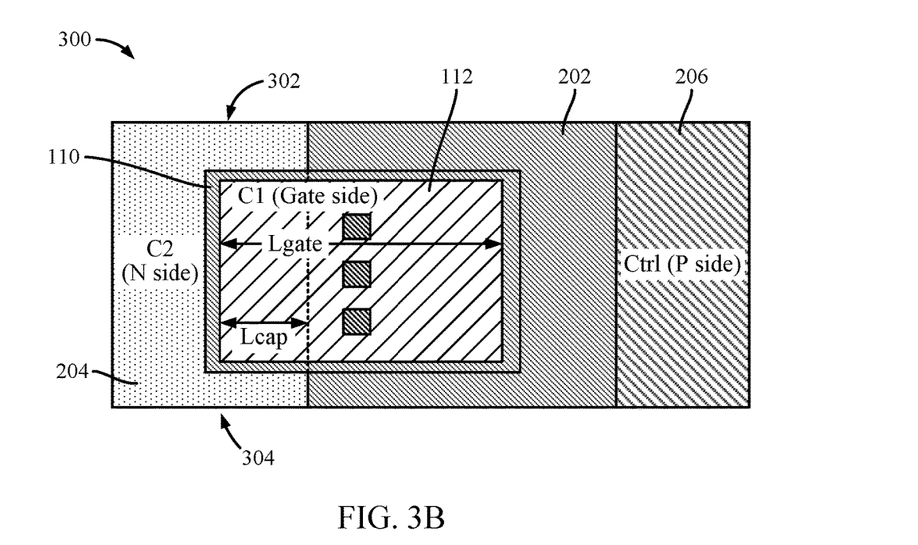

FIGS. 3A and 3B illustrate a cross-sectional view and a top-down view, respectively, of an example structure of a TC device 300, in accordance with certain aspects of the present disclosure. Here, similar to the TC device 200 of FIG. 2, an insulative region 202 is used to separate at least a portion of the non-insulative region 204 from at least a portion of the control region 206 under the non-insulative region 112, such that the length Lcap can be reduced independently of the gate length Lgate. In FIGS. 3A and 3B, contrary to the TC device 200 of FIG. 2, the non-insulative region 112 does not extend to edges of the transcap structure 300 as viewed from the top-down in FIG. 3B. Moreover, the non-insulative region 204 extends to the edges 302 and 304 of the structure of the TC device 300 as viewed from the top down.

Figure 4A:
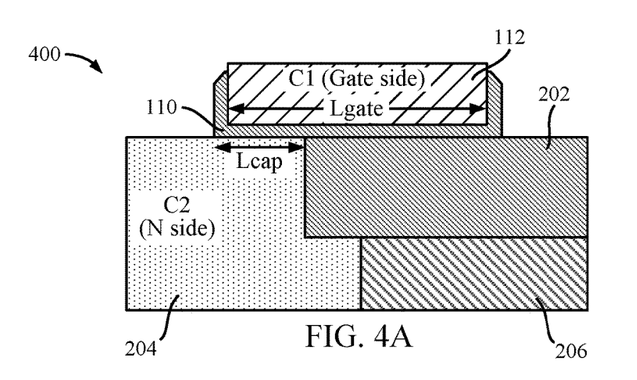
FIGS. 4A, 4B, and 4C illustrate an example structure of a variable capacitor with a control region disposed adjacent to at least three sides of an insulative region, in accordance with certain aspects of the present disclosure.
Figure 4B:
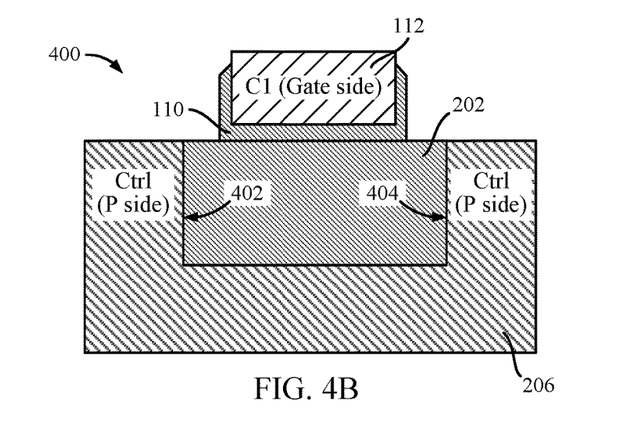
Figure 4C:
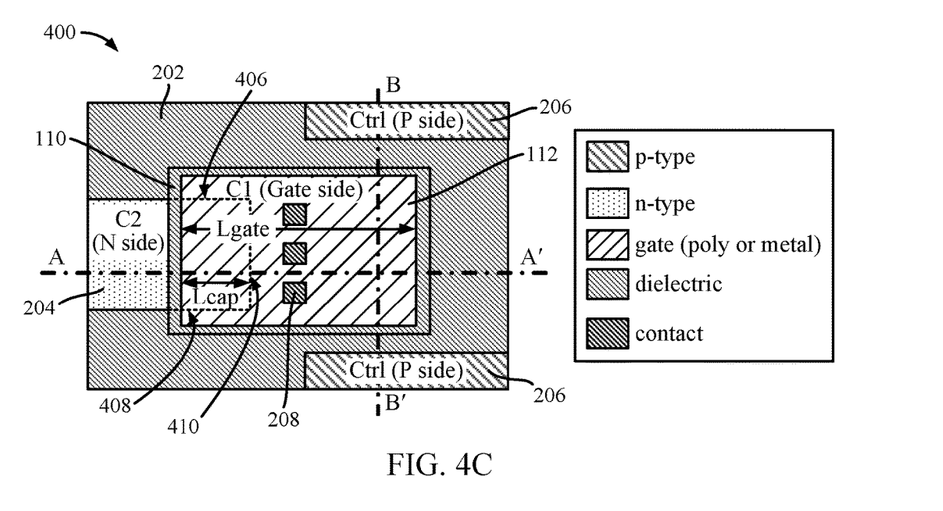

FIGS. 4A, 4B, and 4C illustrate cross-sectional views and a top-down view of an example structure of a TC device 400, in accordance with certain aspects of the present disclosure. FIG. 4A represents the cross-section taken through the line AA' in FIG. 4C. In the TC device 400, an insulative region 202 is used to separate at least a portion of the non-insulative region 204 from at least a portion of the control region 206 under the non-insulative region 112, such that the length Lcap can be reduced independently of the gate length Lgate. In this case, the control region 206 is formed adjacent to at least three sides of the insulative region 202 as viewed in the cross-section of FIG. 4B, taken through the line BB' in FIG. 4C. Therefore, in one plane, at least a portion of the insulative region 202 is formed between at least two sides 402 and 404 of the control region 206, as shown in the top-down view of FIG. 4C. Moreover, the width of the non-insulative region 112 is greater than the width of the non-insulative region 204. Thus, the non-insulative region 112 overlaps three edges 406, 408, 410 of a top side of the non-insulative region 204.

Figure 4D:
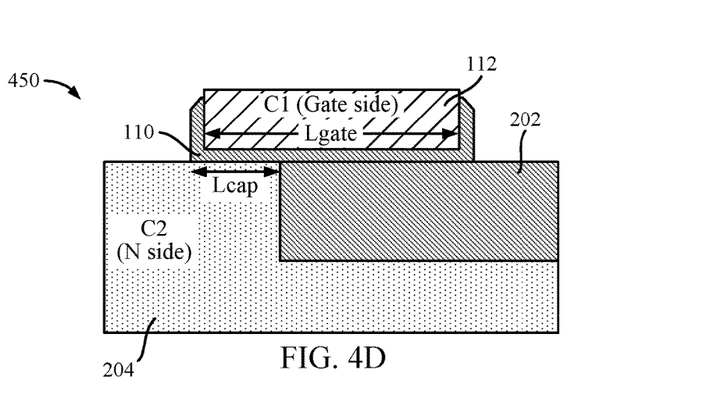
FIGS. 4D, 4E, and 4F illustrate an example structure of a semiconductor capacitor, in accordance with certain aspects of the present disclosure.
Figure 4E:
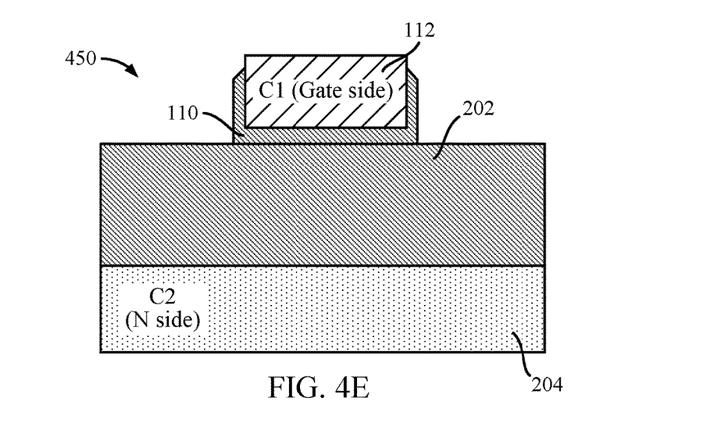
Figure 4F:
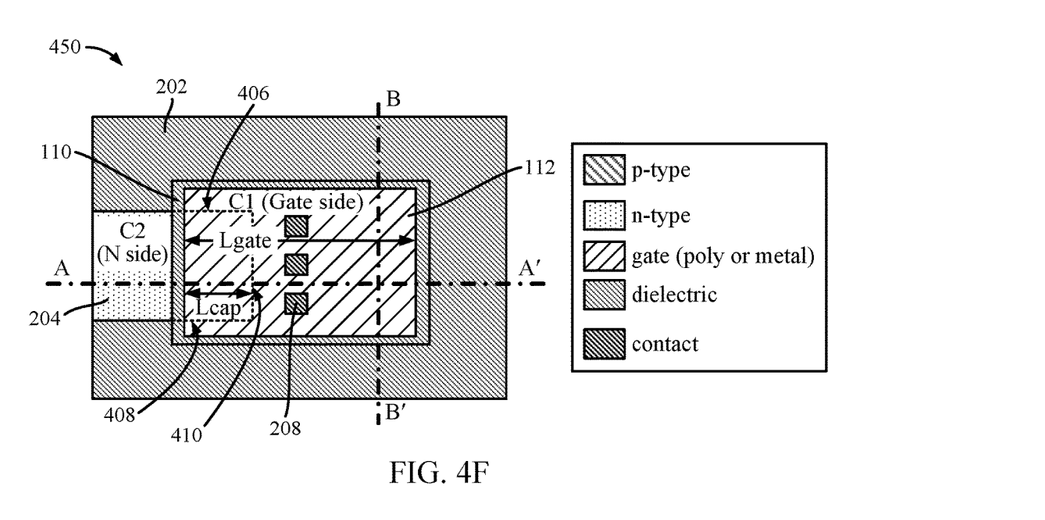

FIGS. 4D, 4E, and 4F illustrate cross-sectional views and a top-down view of an example structure of a semiconductor capacitor 450, in accordance with certain aspects of the present disclosure. The structure of the semiconductor capacitor 450 is similar to the structure of the TC device 400, but without the control region 206.

Figure 5A:
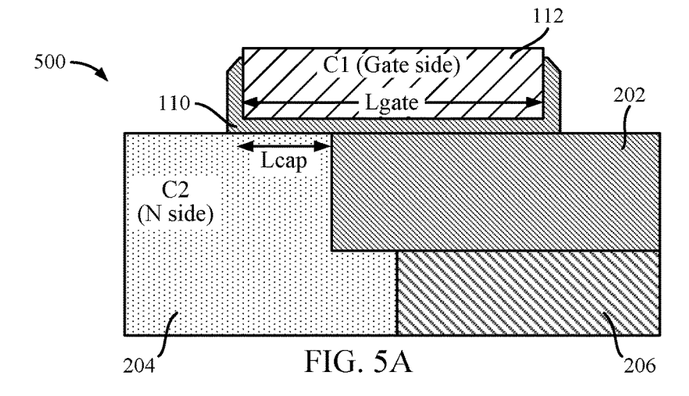
FIGS. 5A, 5B, and 5C illustrate an example structure of a variable capacitor having a gate region that overlaps a single edge of a top side of a non-insulative region, in accordance with certain aspects of the present disclosure.
Figure 5B:
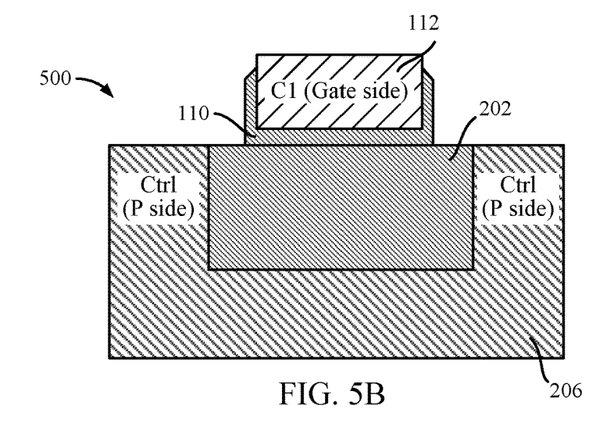
Figure 5C:
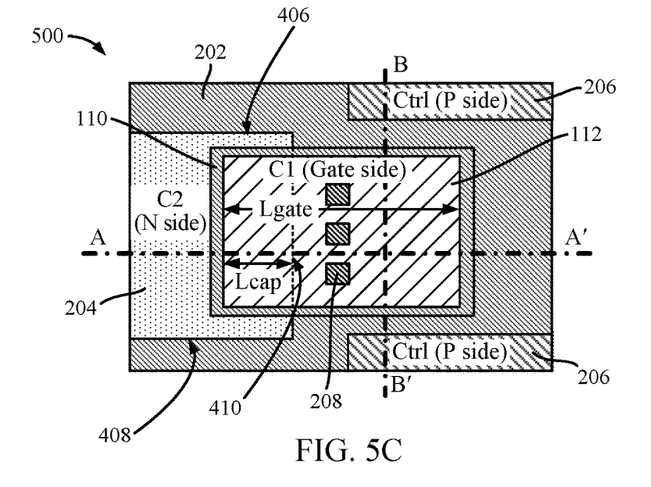

FIGS. 5A, 5B, and 5C illustrate cross-sectional views and a top-down view of an example structure of a TC device 500, in accordance with certain aspects of the present disclosure. FIG. 5A represents the cross-section taken through the line AA' in FIG. 5C, whereas FIG. 5B represents the cross-section taken through the line BB'. In the TC device 500, an insulative region 202 is used to separate at least a portion of the non-insulative region 204 from at least a portion of the control region 206 under the non-insulative region 112, such that the length Lcap can be reduced independently of the gate length Lgate. In this case, the width of the non-insulative region 204 is greater than the width of the non-insulative region 112. Thus, the non-insulative region 112 overlaps one edge 410 of the top side of the non-insulative region 204, as opposed to the structure of TC device 400, where the non-insulative region 112 overlaps three edges 406, 408, 410 of the top side of the non-insulative region 204 (see, e.g., FIG. 5C).

Figure 5D:
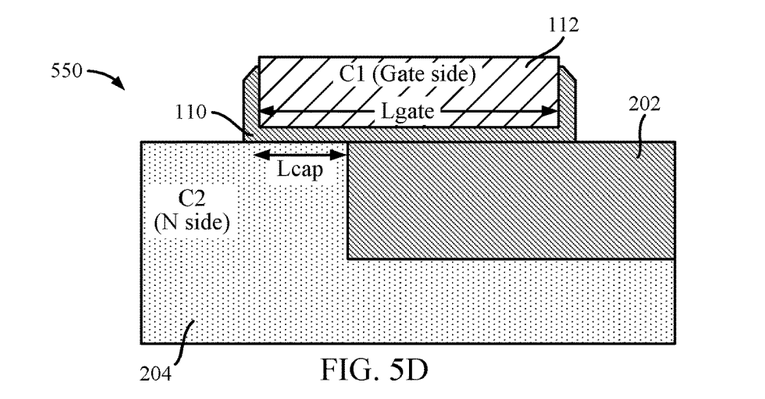
FIGS. 5D, 5E, and 5F illustrate an example structure of a semiconductor capacitor having a gate region that overlaps a single edge of a top side of a non-insulative region, in accordance with certain aspects of the present disclosure.
Figure 5E:
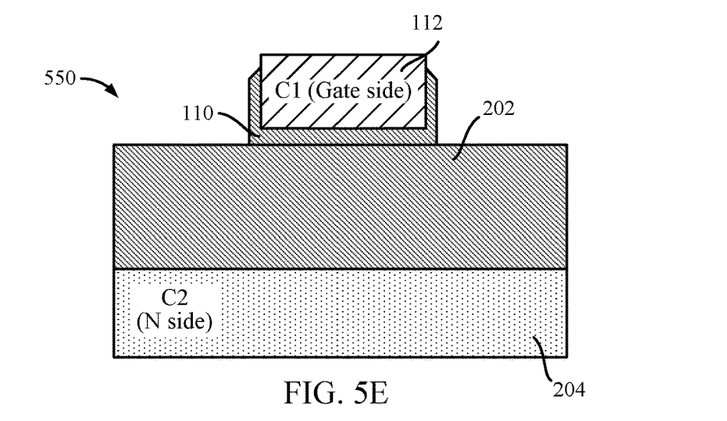
Figure 5F:
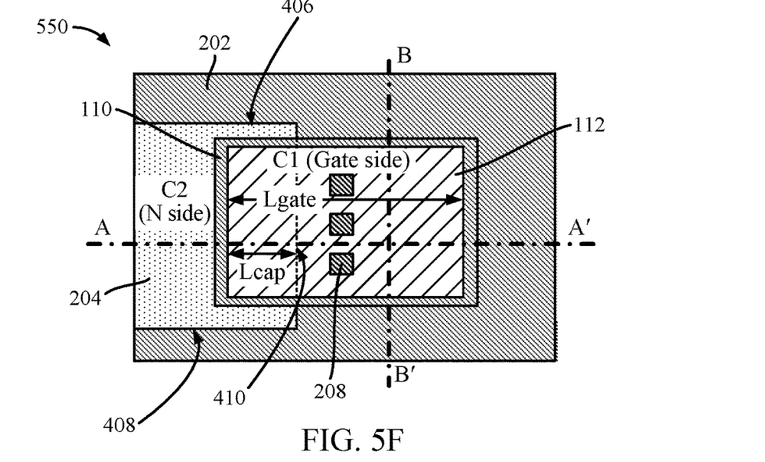

FIGS. 5D, 5E, and 5F illustrate cross-sectional views and a top-down view of an example structure of a semiconductor capacitor 550, in accordance with certain aspects of the present disclosure. The structure of the semiconductor capacitor 550 is similar to the structure of the TC device 500, but without the control region 206.

Figure 6:
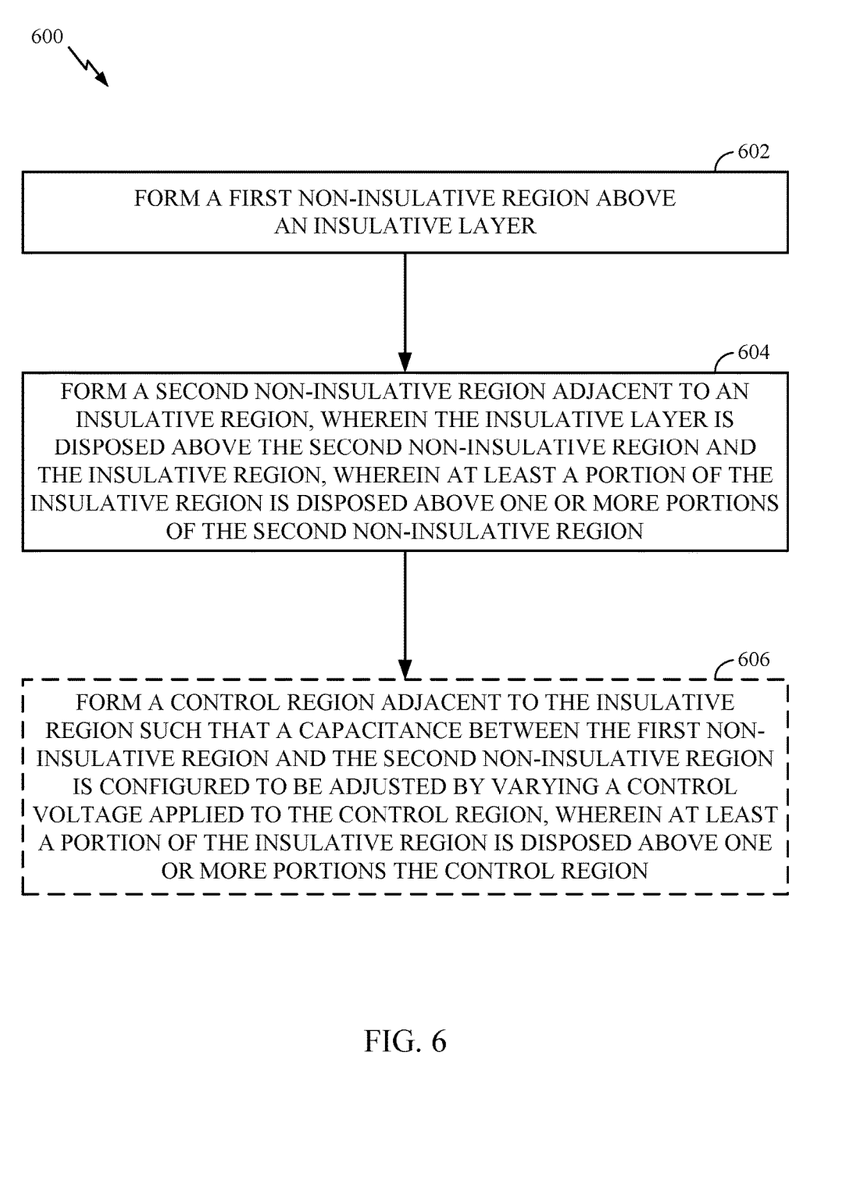
FIG. 6 is a flow diagram of example operations for fabricating a variable capacitor, in accordance with certain aspects of the present disclosure.

FIG. 6 is a flow diagram of example operations 600 for fabricating a semiconductor capacitor, in accordance with certain aspects of the present disclosure. The operations 600 may be performed, for example, by a semiconductor processing chamber.

Operations 600 may begin, at block 602, by forming a first non-insulative region (e.g., non-insulative region 112) above an insulative layer (e.g., a dielectric layer, such as oxide layer 110). At block 604, a second non-insulative region (e.g., non-insulative region 204) is formed adjacent to an insulative region (e.g., insulative region 202), wherein the insulative layer is disposed above the second non-insulative region and the insulative region. In certain aspects, at least a portion of the insulative region is disposed above one or more portions of the second non-insulative region.

At block 606, a control region (e.g., control region 206) is optionally formed adjacent to the insulative region such that a capacitance between the first non-insulative region and the second non-insulative region is configured to be adjusted by varying a control voltage applied to the control region. In certain aspects, at least a portion of the insulative region is disposed above one or more portions of the control region.

Figure 7A:
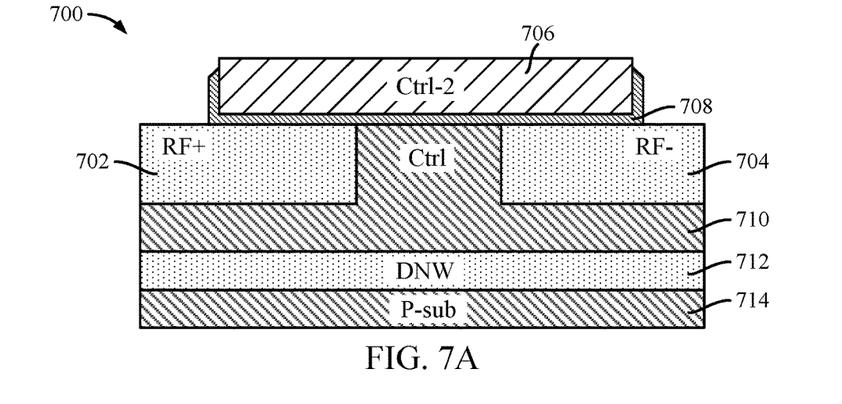
FIGS. 7A, 7B, and 7C illustrate an example structure of a differential variable capacitor with a control region interposed between two non-insulative regions, in accordance with certain aspects of the present disclosure.
Figure 7B:
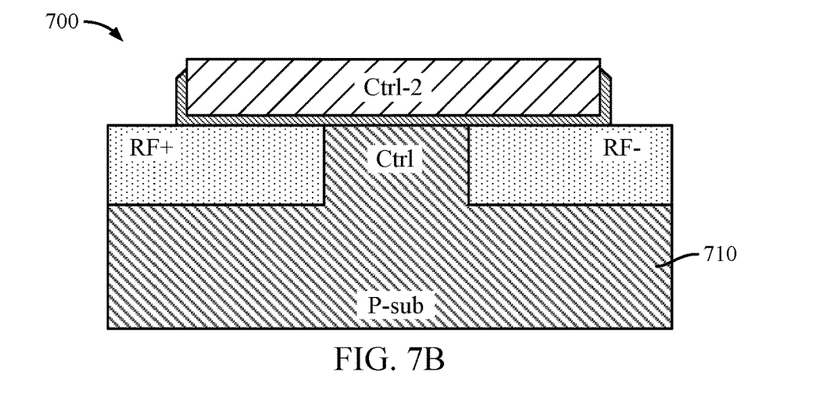
Figure 7C:
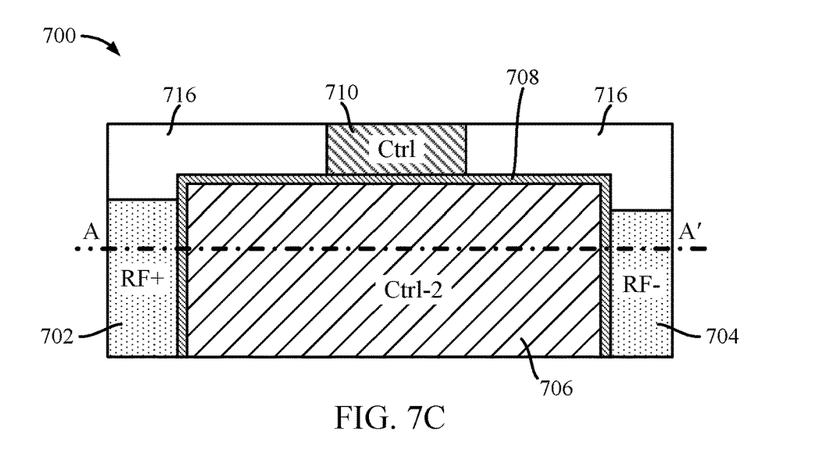

FIGS. 7A, 7B, and 7C illustrate cross-sectional views and a top-down view of an example structure of a differential TC device 700, in accordance with certain aspects of the present disclosure. FIGS. 7A and 7B represent the cross-section taken through the line AA' as shown in FIG. 7C, in accordance with different aspects of the present disclosure. In this example, RF+ and RF− terminals correspond to the positive and negative nodes of a differential RF port for a differential RF signal. The RF+ terminal may be coupled to a non-insulative region 702, and the RF− terminal may be coupled to a non-insulative region 704. Both non-insulative regions 702, 704 may be analogous in function and/or structure to non-insulative region 106 or 204, for example. The differential TC device 700 may have multiple control regions, each of which may be analogous in function and/or structure to non-insulative region 108 or 206. For example, a first control region 706 may be disposed above an insulative layer 708, and a second control region 710 may be interposed between the non-insulative regions 702 and 704 in one plane. In another plane, the second control region 710 may be disposed below the non-insulative regions 702 and 704, as shown. The second control region 710 may be disposed above a deep n-well (DNW) region 712 and a p-doped substrate (p-sub) region 714. In certain aspects, the second control region 710 may be part of the p-sub region 714, as illustrated in the cross-section shown in FIG. 7B, as opposed to the cross-section shown in FIG. 7A where the second control region 710 is separated from the p-sub by the DNW region 712.

FIG. 7C is a top-down view of the example structure of the differential TC device 700. As illustrated, the non-insulative regions 702 and 704 and the control region 710 may be disposed adjacent to an insulative (e.g., dielectric) region 716. One or more portions of the first control region 706 may also be disposed above the insulative region 716. In operation, a bias voltage may be applied to at least one of the control regions 706 or 710, forming depletion regions around the non-insulative regions 702 and 704. By forming the depletion regions, the capacitance of the TC device 700 may be adjusted by modulating the channel size between the non-insulative regions 702 and 704.

Figure 8A:
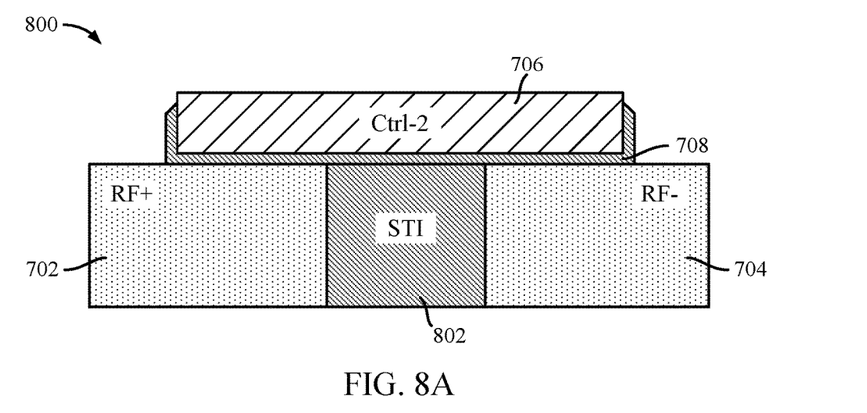
FIGS. 8A and 8B illustrate an example structure of a differential variable capacitor with an insulative region interposed between two non-insulative regions, in accordance with certain aspects of the present disclosure.
Figure 8B:
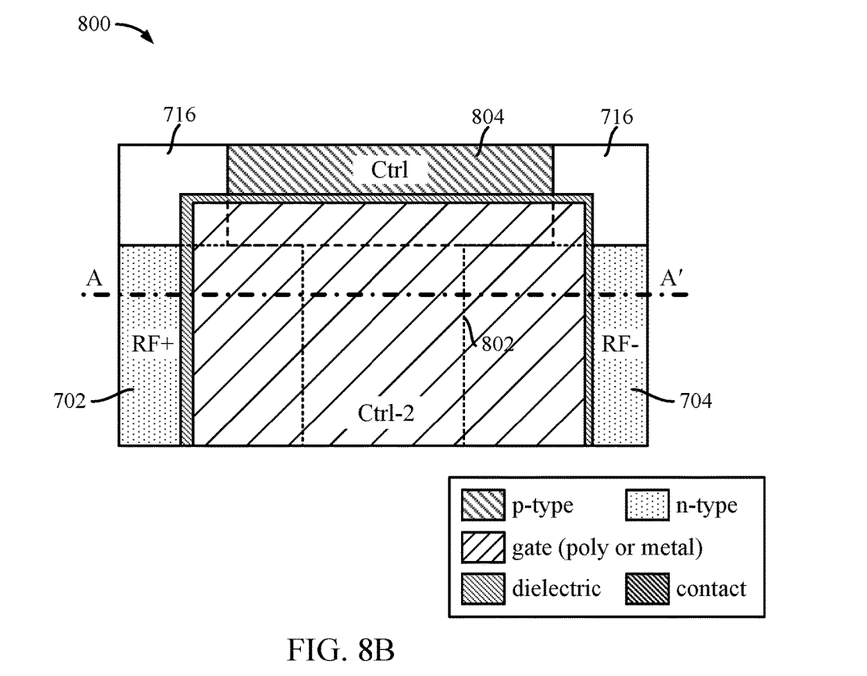

FIGS. 8A and 8B illustrate a cross-sectional view and a top-down view, respectively, of an example structure of a differential TC device 800, in accordance with certain aspects of the present disclosure. FIG. 8A represents the cross-section taken through the line AA' as shown in FIG. 8B. In this case, the control region 706 is disposed above an insulative region 802, which may be implemented using a shallow trench isolation (STI) region. As illustrated in the top-down view of FIG. 8B, the insulative region 802 may be disposed adjacent to another control region 804 disposed between two portions of the insulative region 716. A bias voltage may be applied to at least one of the control regions 706 or 804, forming depletion regions around the non-insulative regions 702 and 704. By forming the depletion regions, the capacitance of the differential TC device 800 may be adjusted by modulating the channel size between the non-insulative regions 702 and 704.

Figure 9A:
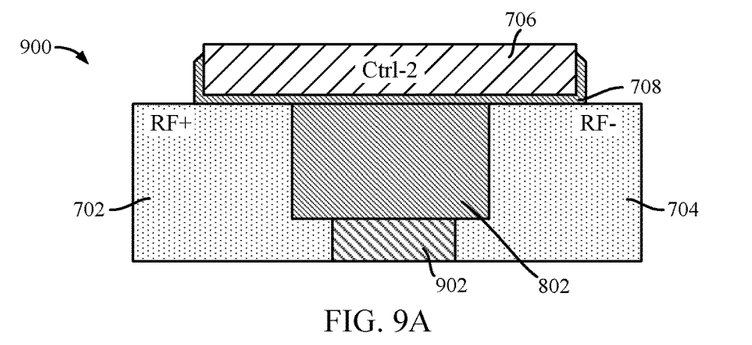
FIGS. 9A, 9B, and 9C illustrate an example structure of a differential variable capacitor having a control region that overlaps a single edge of a top side of a non-insulative region, in accordance with certain aspects of the present disclosure.
Figure 9B:
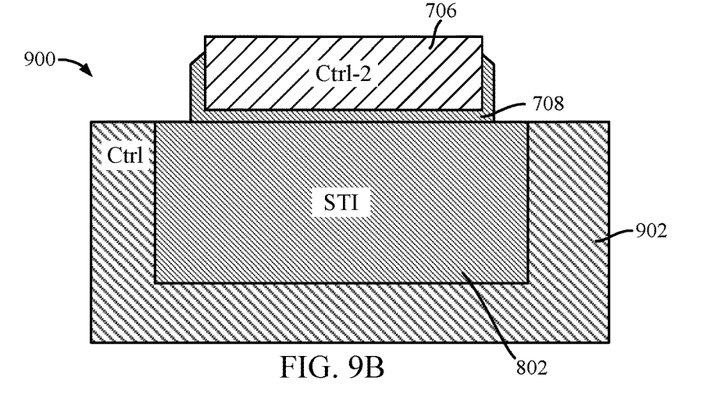
Figure 9C:
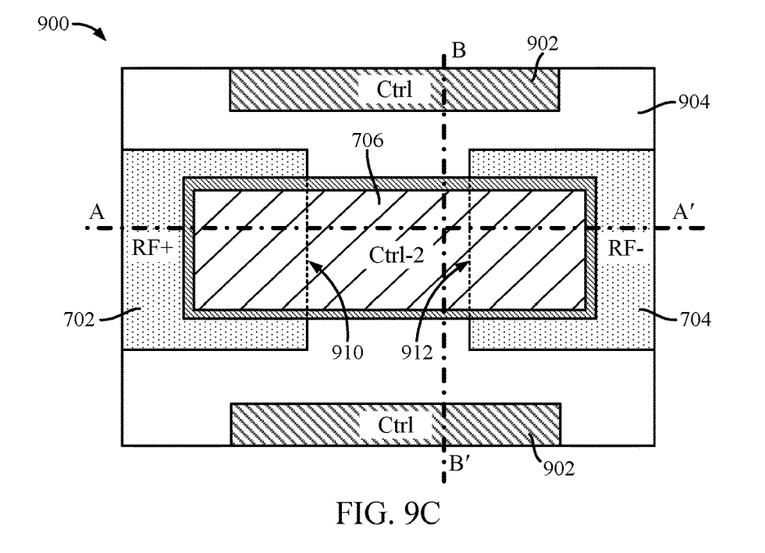

FIGS. 9A, 9B, and 9C illustrate cross-sectional views and a top-down view of an example structure of a differential TC device 900, in accordance with certain aspects of the present disclosure. FIG. 9A represents the cross-section taken through the line AA' in FIG. 9C, whereas FIG. 9B represents the cross-section taken through the line BB'. In the differential TC device 900, a control region 902 is formed below the insulative region. The control region 902 is formed adjacent to at least three sides of the insulative region 802 as viewed from the cross-section of FIG. 9B. As viewed from the top down, the first control region 706 overlaps one edge 910 of a top side of the non-insulative region 702. In some cases, the first control region 706 also overlaps one edge 912 of a top side of the non-insulative region 704. A bias voltage may be applied to at least one of the control regions 706 or 902, forming depletion regions around the non-insulative regions 702 and 704. By forming the depletion regions, the capacitance of the differential TC device 900 may be adjusted by modulating the channel size between the non-insulative regions 702 and 704.

Figure 10A:
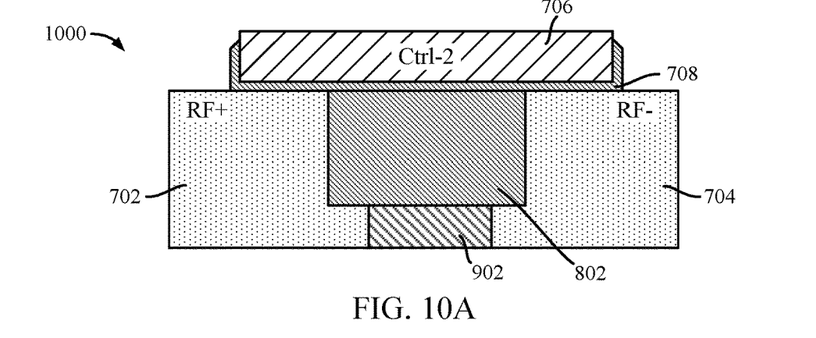
FIGS. 10A, 10B, and 10C illustrate an example structure of a differential variable capacitor having a control region that overlaps three edges of a top side of a non-insulative region, in accordance with certain aspects of the present disclosure.
Figure 10B:
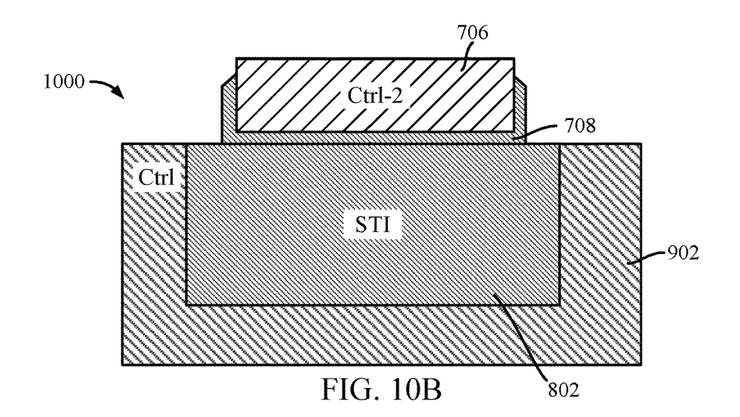
Figure 10C:
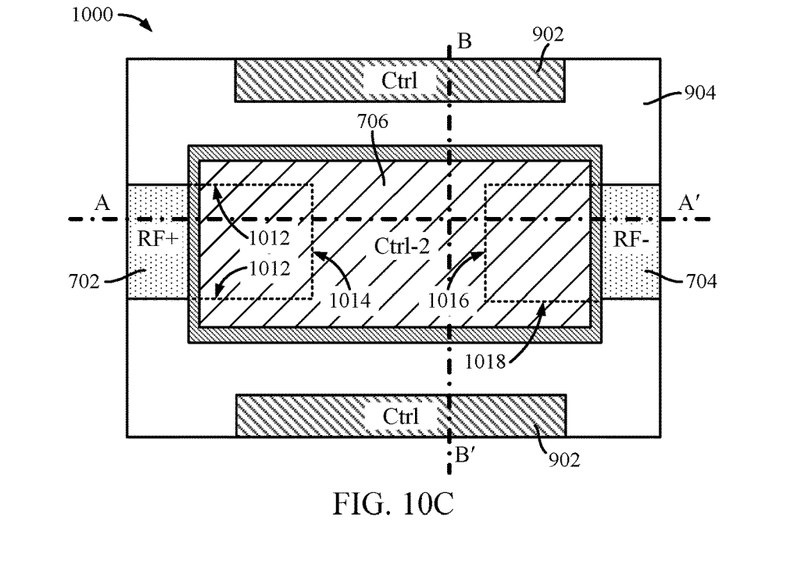

FIGS. 10A, 10B, and 10C illustrate cross-sectional views and a top-down view of an example structure of a differential TC device 1000, in accordance with certain aspects of the present disclosure. FIG. 10A represents the cross-section taken through the line AA' in FIG. 10C, whereas FIG. 10B represents the cross-section taken through the line BB'. In the differential TC device 1000, the first control region 706 overlaps three edges 1010, 1012, 1014 of a top side of the non-insulative region 702. In some cases, the first control region 706 overlaps three edges 1016, 1018, 1020 of a top side of the non-insulative region 704. The example structures of differential TC devices 700, 800, 900, and 1000 allow for enlargement of the gate region (e.g., the first control region 706) which is used as the internal node in the TC devices, improving the Q of the TC device. For certain aspects, two separated silicided diffusion regions may be used as two plates of the capacitors coupled to the non-insulative regions 702 and 704. As described above, a bias voltage may be applied to at least one of the control regions 706 or 902, forming depletion regions around the non-insulative regions 702 and 704. By forming the depletion regions, the capacitance of the differential TC device 1000 may be adjusted by modulating the channel size between the non-insulative regions 702 and 704.

Figure 11:
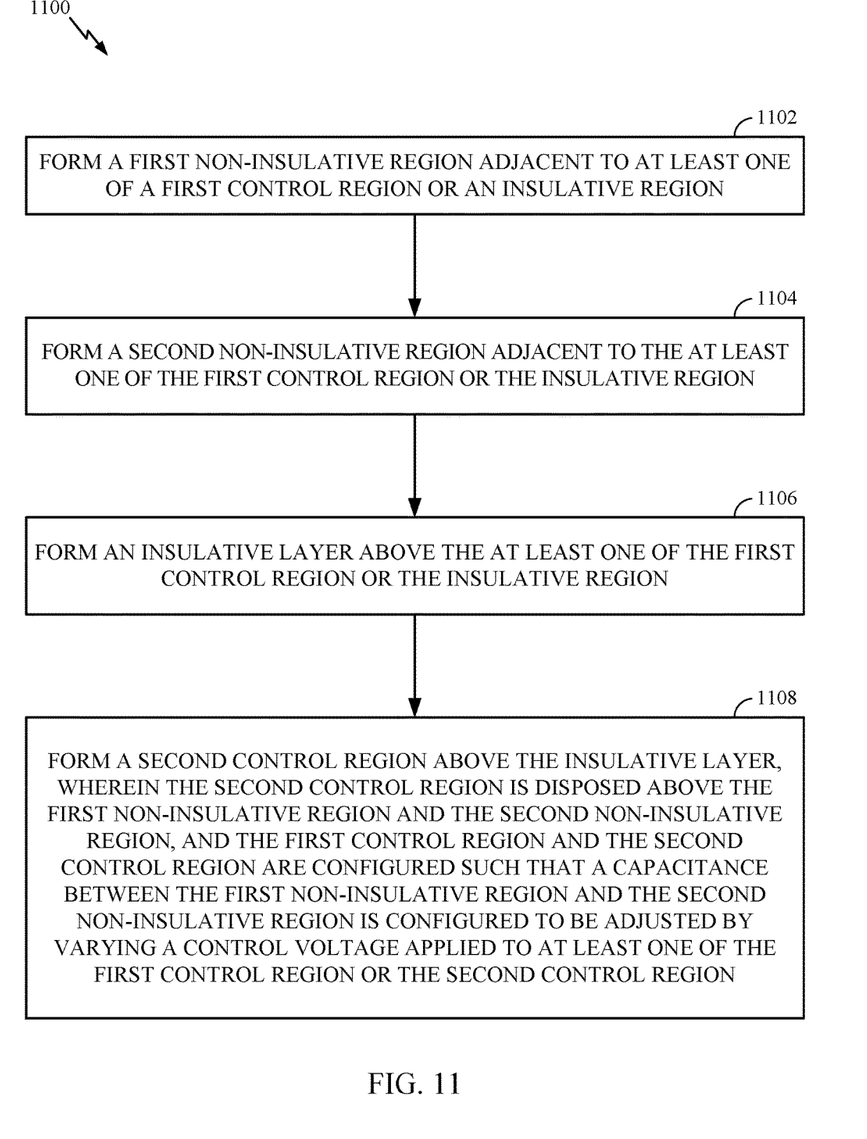
FIG. 11 is a flow diagram of example operations for fabricating a differential variable capacitor, in accordance with certain aspects of the present disclosure.

FIG. 11 is a flow diagram of example operations 1100 for fabricating a semiconductor variable capacitor, in accordance with certain aspects of the present disclosure. The operations 1100 may be performed, for example, by a controller.

Operations 1100 may begin, at block 1102, by forming a first non-insulative region adjacent to at least one of a first control region or an insulative region, and at block 1104, forming a second non-insulative region adjacent to the at least one of the first control region or the insulative region. At block 1106, an insulative layer is formed above the at least one of the first control region or the insulative region, and at block 1108, a second control region is formed above the insulative layer. In certain aspects, the second control region is disposed above the first non-insulative region and the second non-insulative region. The first control region and the second control region may be configured such that a capacitance between the first non-insulative region and the second non-insulative region is configured to be adjusted by varying a control voltage applied to at least one of the first control region or the second control region.

The various operations of methods described above may be performed by any suitable means capable of performing the corresponding functions. The means may include various hardware and/or software component(s) and/or module (s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor capacitor comprising:
   a first non-insulative region disposed above an insulative layer;
   an insulative region;
   a second non-insulative region disposed adjacent to a first side of the insulative region, wherein the insulative layer is disposed above the second non-insulative region and the insulative region, wherein at least a portion of the insulative region is disposed above one or more portions of the second non-insulative region; and
   a control region disposed adjacent to a second side and a third side of the insulative region such that a capacitance between the first non-insulative region and the second non-insulative region is configured to be adjusted by varying a control voltage applied to the control region, wherein at least a portion of the insulative region is disposed above one or more portions the control region, and wherein the second side and the third side are opposite sides of the insulative region.

2. The semiconductor capacitor of claim 1, wherein the control region is disposed adjacent to a bottom side of the insulative region opposite a side of the insulative region on which the insulative layer is disposed.

3. The semiconductor capacitor of claim 1, wherein a portion of the insulative layer is disposed adjacent to a top side of the second non-insulative region, and wherein the first non-insulative region overlaps a single edge of the top side of the second non-insulative region.

4. The semiconductor capacitor of claim 1, wherein the insulative region comprises a shallow trench isolation (STI) region.

5. The semiconductor capacitor of claim 1, wherein a portion of the insulative layer is disposed adjacent to a top side of the second non-insulative region, and wherein the first non-insulative region overlaps three edges of the top side of the second non-insulative region.

6. The semiconductor capacitor of claim 1, wherein a portion of the insulative layer is disposed adjacent to a top side of the second non-insulative region, and wherein the first non-insulative region overlaps a single edge of the top side of the second non-insulative region.

7. The semiconductor capacitor of claim 1, further comprising one or more contacts disposed above the first non-insulative region and the insulative region.

8. The semiconductor capacitor of claim 1, wherein the insulative layer comprises a dielectric layer.

9. A method for fabricating a semiconductor capacitor, comprising:
   forming a first non-insulative region above an insulative layer;
   forming a second non-insulative region adjacent to a first side of an insulative region, wherein the insulative layer is disposed above the second non-insulative region and the insulative region, wherein at least a portion of the insulative region is disposed above one or more portions of at least one of the second non-insulative region; and
   forming a control region disposed adjacent to a second side and a third side of the insulative region such that a capacitance between the first non-insulative region and the second non-insulative region is configured to be adjusted by varying a control voltage applied to the control region, wherein at least a portion of the insulative region is disposed above one or more portions the control region, and wherein the second side and the third side are opposite sides of the insulative region.

* * * * *